United States Patent
Toda et al.

(10) Patent No.: US 6,753,695 B2
(45) Date of Patent: Jun. 22, 2004

(54) SEMICONDUCTOR INTEGRATED CIRCUIT DEVICE AND PULSE WIDTH CHANGING CIRCUIT

(75) Inventors: Haruki Toda, Yokohama (JP); Kenji Tsuchida, Kawasaki (JP); Satoshi Eto, Kawasaki (JP); Kuninori Kawabata, Kawasaki (JP)

(73) Assignees: Kabushiki Kaisha Toshiba, Minato-ku (JP); Fujitsu Limited, Kawasaki (JP)

( * ) Notice: Subject to any disclaimer, the term of this patent is extended or adjusted under 35 U.S.C. 154(b) by 31 days.

(21) Appl. No.: 10/104,069
(22) Filed: Mar. 25, 2002
(65) Prior Publication Data
US 2002/0140459 A1 Oct. 3, 2002

(30) Foreign Application Priority Data

Mar. 29, 2001 (JP) ........................................ 2001-095310

(51) Int. Cl.[7] ............................. H03K 3/017; H03K 5/04
(52) U.S. Cl. ........................... 326/29; 326/122; 327/173
(58) Field of Search ............................. 326/112, 119, 326/121, 122, 29; 327/173, 227

(56) References Cited

U.S. PATENT DOCUMENTS

| 4,931,668 | A | * | 6/1990 | Kikuda et al. ............... 307/443 |
| 5,111,076 | A | * | 5/1992 | Tarng ........................ 307/446 |
| 5,173,622 | A | * | 12/1992 | Maenura ..................... 307/446 |
| 5,336,937 | A | | 8/1994 | Sridhar et al. |
| 5,428,321 | A | | 6/1995 | Yoshida et al. |
| 6,118,390 | A | | 9/2000 | Chen et al. |

FOREIGN PATENT DOCUMENTS

| JP | 61-123218 | 6/1986 |
| TW | 392390 | 6/2000 |
| TW | 091106329 | 8/2003 |

* cited by examiner

Primary Examiner—Daniel Chang
(74) Attorney, Agent, or Firm—Banner & Witcoff, Ltd.

(57) ABSTRACT

A semiconductor integrated circuit device comprises a plurality of MIS transistors, and an integrated circuit unit including logic gate circuits configured by a combination of the plurality of MIS transistors. Each of the MIS transistors has a gate including a circuit element represented by an equivalent circuit in which a capacitance and resistance are parallel-connected.

24 Claims, 9 Drawing Sheets

Basic unit element 1

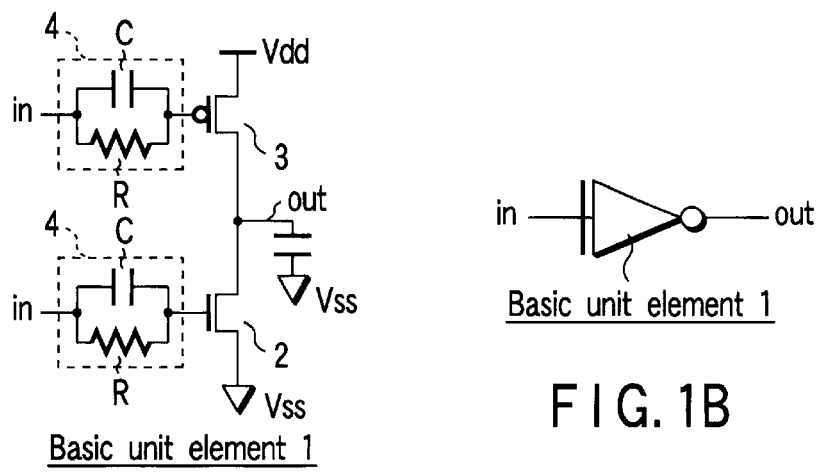
FIG. 1A  Basic unit element 1
FIG. 1B  Basic unit element 1
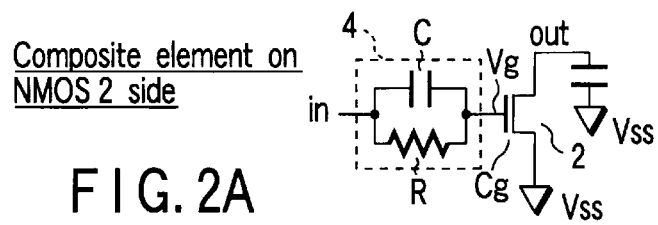
FIG. 2A  Composite element on NMOS 2 side
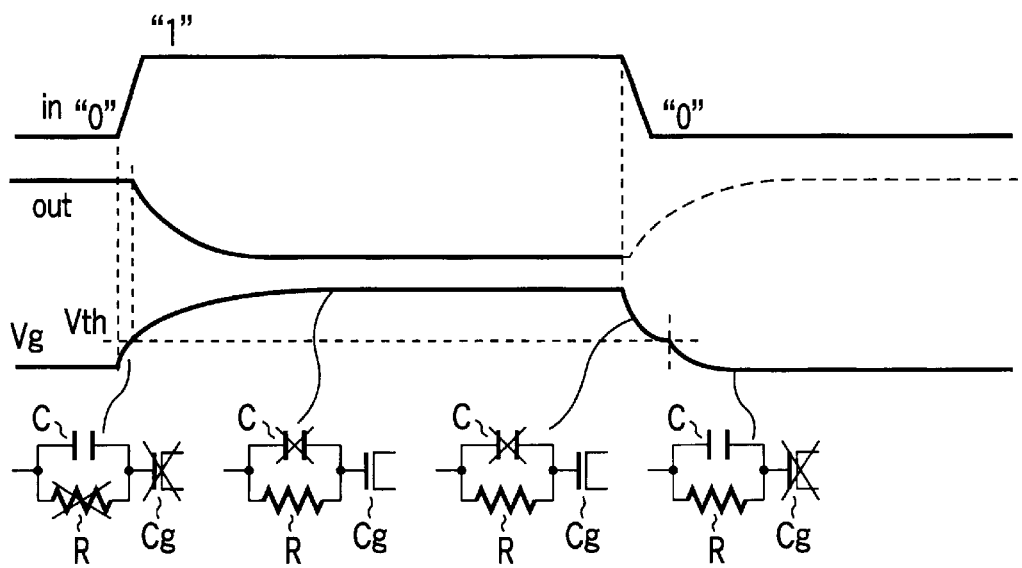
FIG. 2B Composite element on PMOS 3 side

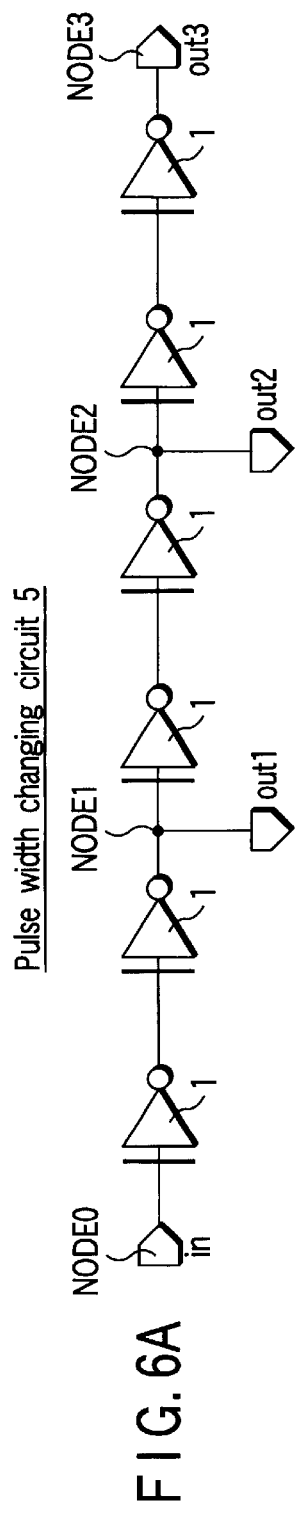
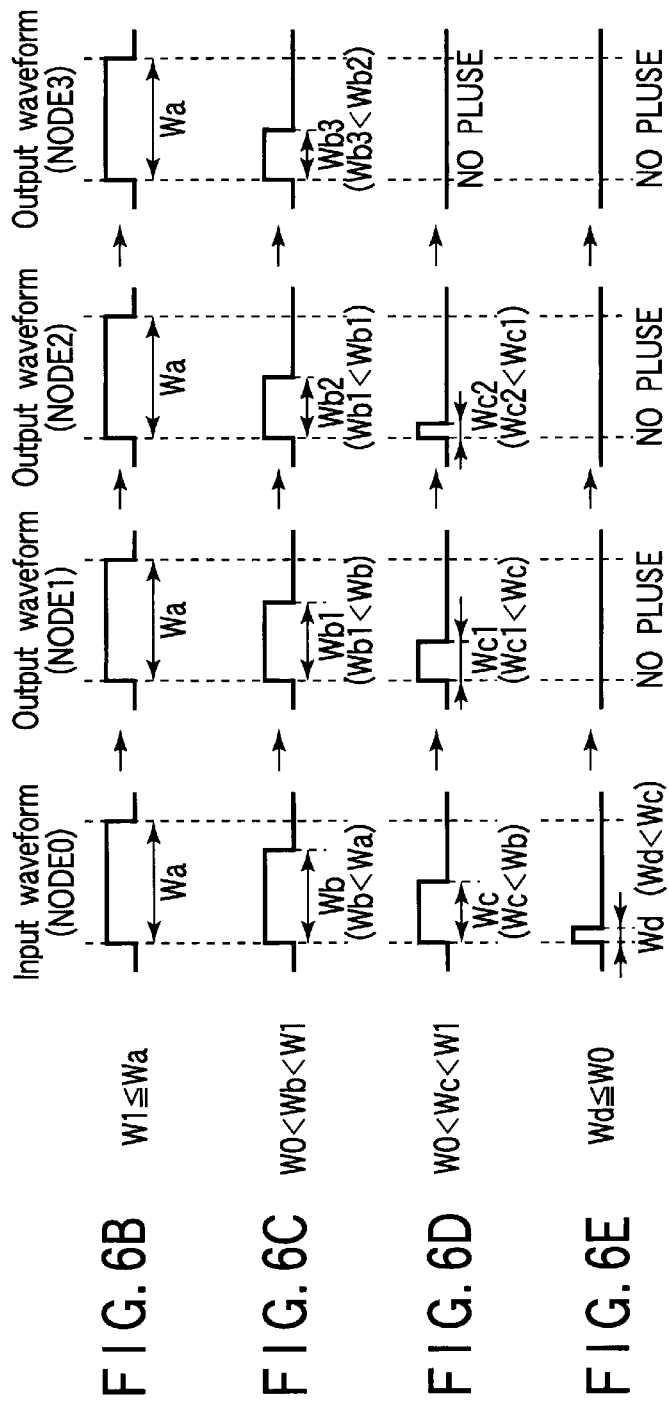
FIG. 6A
FIG. 6B  W1≦Wa
FIG. 6C  W0<Wb<W1
FIG. 6D  W0<Wc<W1
FIG. 6E  Wd≦W0

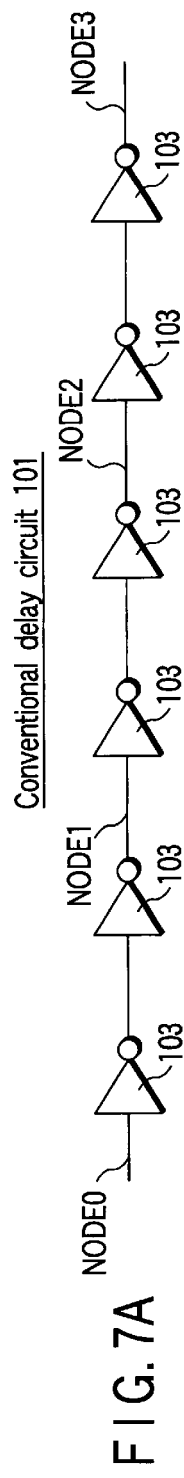
FIG. 7A
Conventional delay circuit 101
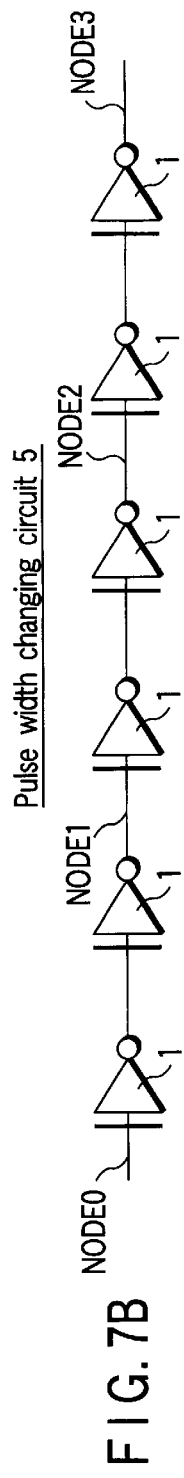
FIG. 7B
Pulse width changing circuit 5
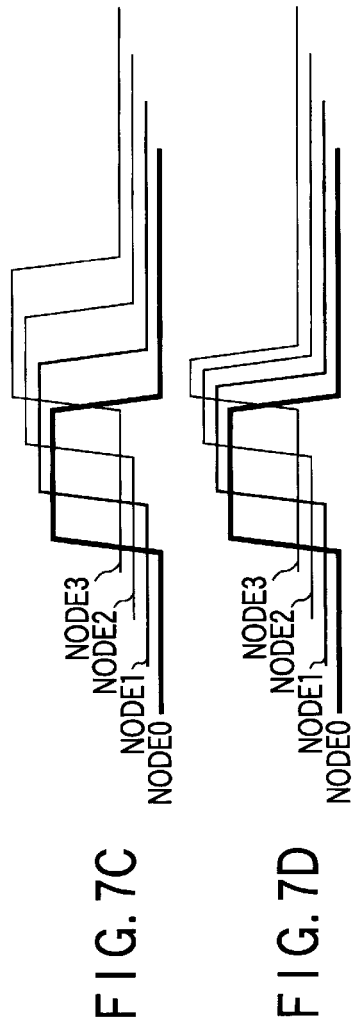
FIG. 7C
FIG. 7D
FIG. 7E

SEMICONDUCTOR INTEGRATED CIRCUIT DEVICE AND PULSE WIDTH CHANGING CIRCUIT

CROSS-REFERENCE TO RELATED APPLICATIONS

This application is based upon and claims the benefit of priority from the prior Japanese Patent Application No. 2001-095310, filed Mar. 29, 2001, the entire contents of which are incorporated herein by reference.

BACKGROUND OF THE INVENTION

1. Field of the Invention

The present invention relates to a semiconductor integrated circuit device and, more particularly, to a semiconductor integrated circuit device for reducing the pulse width of an input pulse.

2. Description of the Related Art

A conventional pulse width changing circuit for changing the pulse width uses a logic gate circuit in order to change a pulse width used in a circuit system. Examples of the pulse width changing circuit are shown in FIGS. 13A, 13B, 14A, and 14B.

FIG. 13A is a circuit diagram showing a circuit for reducing an input pulse width, and FIG. 13B is a waveform chart showing its operation. FIG. 14A is a circuit diagram showing a circuit for widening an input pulse width, and FIG. 14B is a waveform chart showing its operation.

The circuit shown in FIG. 13A is comprised of a delay circuit 101 and AND gate 102. In general, the delay circuit 101 is made up of an even number of inverter circuits 103. The amount of a delay d of the delay circuit 101 is an integer multiple of the gate delay amount of the inverter circuit 103.

As for the operation, as shown in FIG. 13B, the two inputs of the AND gate 102 change to "1" the delay d of the delay circuit 101 after an input "in" changes from "0" to "1". An output "out" changes to "1" upon the lapse of the gate delay amount of the AND gate 102.

Then, the input "in" returns from "1" to "0", and the output "out" returns to "0" upon the lapse of the gate delay amount of the AND gate 102.

In the circuit shown in FIG. 13A, the leading edge of the pulse delays by the delay d of the delay circuit 101, so that the pulse width of the input "in" can be reduced by the delay d.

The circuit shown in FIG. 14A comprises a delay circuit 101 identical to that of FIG. 13A, and an OR gate 104.

As for the operation, as shown in FIG. 14B, the input "in" changes from "0" to "1", and then one input of the OR gate 104 changes to "1". The output "out" changes to "1" upon the lapse of the gate delay amount of the OR gate 104.

The input "in" returns from "1" to "0", and the two inputs of the OR gate 104 change to "0" upon the lapse of the delay d of the delay circuit 101. The output "out" returns to "0" after the lapse of the gate delay amount of the OR gate 104.

In the circuit shown in FIG. 14A, the trailing edge of the pulse delays by the delay d of the delay circuit 101, so that the pulse width of an input pulse can be widened by the delay d.

A conventional circuit for reducing a long input pulse is shown in FIGS. 15A and 15B.

As shown in FIG. 15A, this circuit is constituted by cascade-connecting circuits shown in FIG. 13A, and each circuit reduces the pulse width by the delay d of the delay circuit 101. Various pulse widths can therefore be formed from an input pulse by extracting a pulse from an arbitrary position. FIG. 15B shows output pulses at respective nodes (NODE0 to NODE2) together with the delay state.

The conventional circuits shown in FIGS. 13A, 13B, 14A, 14B, 15A, and 15B are effective only for an input pulse with a pulse width larger than the delay d of the delay circuit 101. In addition, the amount of the delay d is equal to or larger than the gate delay amount of the logic gate circuit such as the inverter circuit 103.

In principle, the conventional circuit cannot slightly reduce the pulse width by an amount smaller than the delay d of the delay circuit 101, i.e., cannot reduce the pulse width by an amount smaller than the gate delay amount of the logic gate circuit.

Since the conventional circuit is configured by a combination of an AND or OR gate and a delay circuit 101 including a plurality of logic gate circuits, it requires a large number of circuit elements and is bulky. This inhibits an increase in the integration degree of a semiconductor integrated circuit device and reduction in chip area.

BRIEF SUMMARY OF THE INVENTION

A semiconductor integrated circuit device according to a first aspect of the present invention comprises: a plurality of MIS transistors, each of the MIS transistors having a gate including a circuit element represented by an equivalent circuit in which a capacitance and a resistance are parallel-connected; and an integrated circuit unit including logic gate circuits configured by a combination of the plurality of MIS transistors.

A pulse width changing circuit according to a second aspect of the present invention comprises: cascade-connected logic gate circuits, wherein the pulse width changing circuit reduces a pulse width by an amount smaller than a gate delay amount of the logic gate circuit.

BRIEF DESCRIPTION OF THE SEVERAL VIEWS OF THE DRAWING

FIG. 1A is an equivalent circuit diagram showing a basic unit element used in a pulse width changing circuit according to the first embodiment of the present invention;

FIG. 1B is a diagram showing a sign representing the basic unit element of FIG. 1A in this specification;

FIG. 2A is a circuit diagram showing an NMOS-side composite element;

FIG. 2B is a waveform chart showing the operation of the NMOS-side composite element;

FIG. 6A is a circuit diagram showing an example of the pulse width changing circuit according to the first embodiment of the present invention;

FIGS. 6B, 6C, 6D, and 6E are charts schematically showing the relationship between the pulse widths of input and output pulses;

FIG. 7A is a circuit diagram showing a conventional delay circuit obtained by cascade-connecting inverter circuits;

FIG. 7B is a circuit diagram showing the pulse width changing circuit according to the first embodiment of the present invention;

FIG. 7C is a view showing an output waveform example when an input with a small pulse width is input to the delay circuit shown in FIG. 7A;

FIG. 7D is a view showing an output waveform example when an input with a small pulse width is input to the pulse width changing circuit shown in FIG. 7B;

FIG. 7E is a view showing an output waveform example when an input with a large pulse width is input to the delay circuit shown in FIG. 7A and the pulse width changing circuit shown in FIG. 7B;

DETAILED DESCRIPTION OF THE INVENTION

Figure 3A:
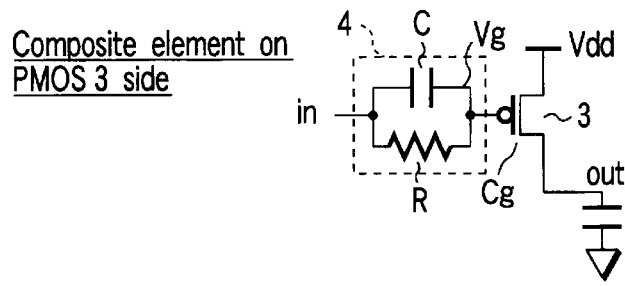
FIG. 3A is a circuit diagram showing a PMOS-side composite element.

If the pulse width can be reduced by an amount smaller than the gate delay amount of a logic gate circuit, which is conventionally impossible, setting of a smaller pulse width and finer tuning of a circuit system, which are also conventionally impossible, can be realized.

These advantages are very effective for a circuit system predicted to increase in operation speed.

Several embodiments of the present invention will be described below with reference to the several views of the accompanying drawings. In the following description, the same reference numerals denote the same parts through all the views.

First Embodiment

FIG. 1A is an equivalent circuit diagram showing a basic unit element which constitutes a pulse width changing circuit according to the first embodiment of the present invention.

As shown in FIG. 1A, a basic unit element 1 comprises an N-channel MOS transistor (to be referred to as an NMOS hereinafter) 2 and a P-channel MOS transistor (to be referred to as a PMOS hereinafter) 3 which are series-connected between a high-potential power supply Vdd and a low-potential power supply Vss (e.g., ground potential), basically similar to a conventional inverter circuit.

The basic unit element 1 according to the present invention is different from the conventional inverter circuit in that the gates of the NMOS 2 and PMOS 3 respectively include circuit elements 4 each having a capacitance C and resistance R parallel-connected to each other as an equivalent circuit, and that each of the NMOS 2 and PMOS 3 is formed as a composite element with the circuit element 4. A sign representing the basic unit element 1 in this specification is shown in FIG. 1B.

The operation of the composite element on the NMOS 2 side and that of the composite element on the PMOS 3 side will be explained.

Figure 3B:
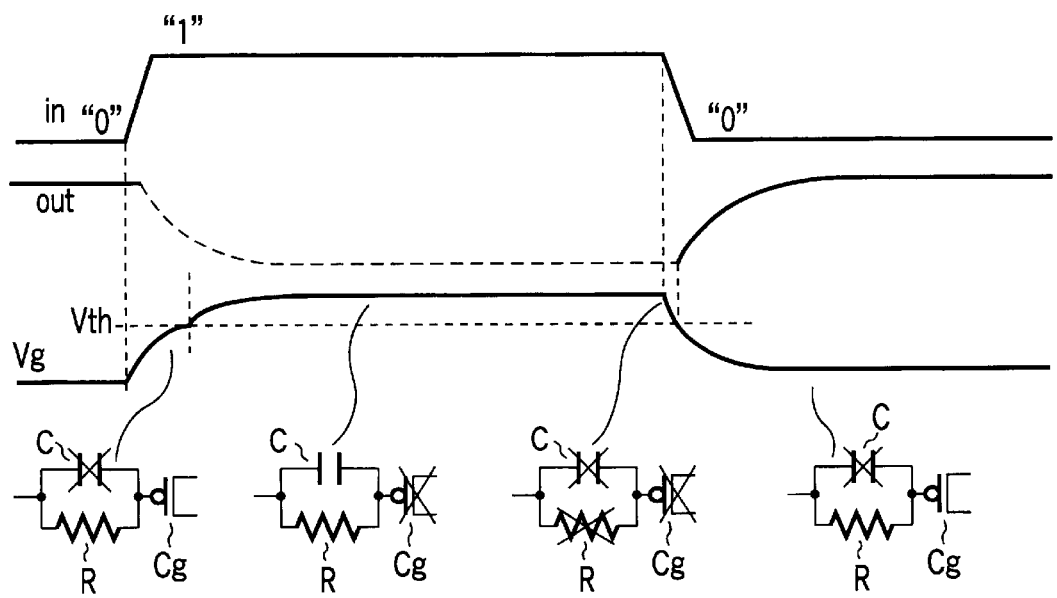
FIG. 3B is a waveform chart showing the operation of the PMOS-side composite element.

FIG. 2A is a circuit diagram showing the composite element on the NMOS 2 side, and FIG. 2B is a waveform chart showing its operation. FIG. 3A is a circuit diagram showing the composite element on the PMOS 3 side, and FIG. 3B is a waveform chart showing its operation. The operation waveform charts in FIGS. 2 and 3 assume reception of a very long input pulse. By assuming reception of such a very long input pulse, an input pulse can be predicted by operations at the leading and trailing edges of the input pulse even if the pulse is short irrespective of its polarity.

Operation of Composite Element on NMOS 2

As shown in FIG. 2B, an input "in" changes from "0" to "1". Since the NMOS 2 is OFF at this time, a gate capacitance Cg is very small. Thus, coupling by the capacitance C makes a gate potential Vg abruptly rise to a threshold value Vth of the NMOS 2.

The equivalent circuit in this state can be regarded to be constituted by only the capacitance C.

When the gate potential Vg reaches the threshold value Vth of the NMOS 2 to turn it on, the effective gate capacitance Cg becomes large, and the potential of the output "out" starts decreasing due to discharge. Coupling acts in a direction in which the rising gate potential Vg is decreased, so that the effective gate capacitance Cg becomes much larger. The gate potential Vg at this time rises at an RCg time constant determined by the resistance R and gate capacitance Cg.

The equivalent circuit in this state can be regarded to be constituted by the resistance R and the gate capacitance Cg of the NMOS 2 as the capacitance C can be ignored.

A long time is required until the gate potential Vg reaches the same "1" level as the input "in", during which the input "in" must hold "1". If a positive pulse at the input "in" is short, the gate potential Vg cannot sufficiently rise.

Then, the input "in" changes from "1" to "0". The gate capacitance Cg exists until the NMOS 2 is turned off. The gate potential Vg falls by the RCg time constant determined by the resistance R and gate capacitance Cg.

Meanwhile, the output "out" is charged by the composite element on the PMOS 3 side, and its potential rises, as represented by the dotted line in FIG. 2B. This rise also causes coupling. However, the resistance of the NMOS 2 in OFF operation rises more abruptly than that in ON operation of the NMOS 2, so the coupling rapidly decreases. The effective gate capacitance Cg hardly increases. The RCg time constant effectively becomes smaller than that upon rise of the gate potential Vg, and the gate potential Vg changes sharply.

When the gate potential Vg decreases to be smaller than the threshold value Vth of the NMOS 2 and the NMOS 2 is turned off, the gate capacitance Cg can be ignored. Electric charges left in the capacitance C are discharged via the resistance R, and the gate potential Vg rapidly falls to "0".

Operation of Composite Element on PMOS 3

As shown in FIG. 3B, the input "in" changes from "0" to "1". Since the PMOS 3 is ON at this time, the gate capacitance Cg exists and the gate potential Vg rises at the RCg time constant determined by the resistance R and gate capacitance Cg.

Meanwhile, the output "out" is discharged by the composite element on the NMOS 2 side, and its potential falls, as represented by the dotted line in FIG. 3B. Coupling makes the effective gate capacitance Cg large. However, the gate potential Vg so rises as to turn off the PMOS 3. The coupling is relatively small, and the gate potential Vg rises more rapidly than that in ON operation of the PMOS 3.

The equivalent circuit in this state can be regarded to be constituted by only the resistance R and gate capacitance Cg.

When the gate potential Vg exceeds the threshold value Vth of the PMOS 3 to turn it off, the gate capacitance Cg disappears. The gate potential Vg so rises as to charge the capacitance C via the resistance R. The RC time constant by the resistance R and capacitance C is small, and the gate potential Vg abruptly rises to "1".

When the input "in" changes from "1" to "0", the gate capacitance Cg is negligible until the PMOS 3 is turned on. Coupling by the capacitance C makes the gate potential Vg fall to the threshold value Vth of the PMOS 3 in accordance with the input "in".

When the gate potential Vg reaches the threshold value Vth of the PMOS 3 to turn it on, the gate capacitance Cg is increased and charge of the output "out" starts. Coupling acts in a direction in which the falling gate potential Vg is increased, so that the effective gate capacitance Cg becomes large, and the effective RCg time constant becomes large. The gate potential Vg falls relatively slowly.

To change the gate potential Vg to the same "0" as the input "in", the input "in" must be held at "0" level for a long time. For this reason, if a short negative pulse is applied to the input "in", the gate potential Vg cannot fully fall to "0".

Figure 4:
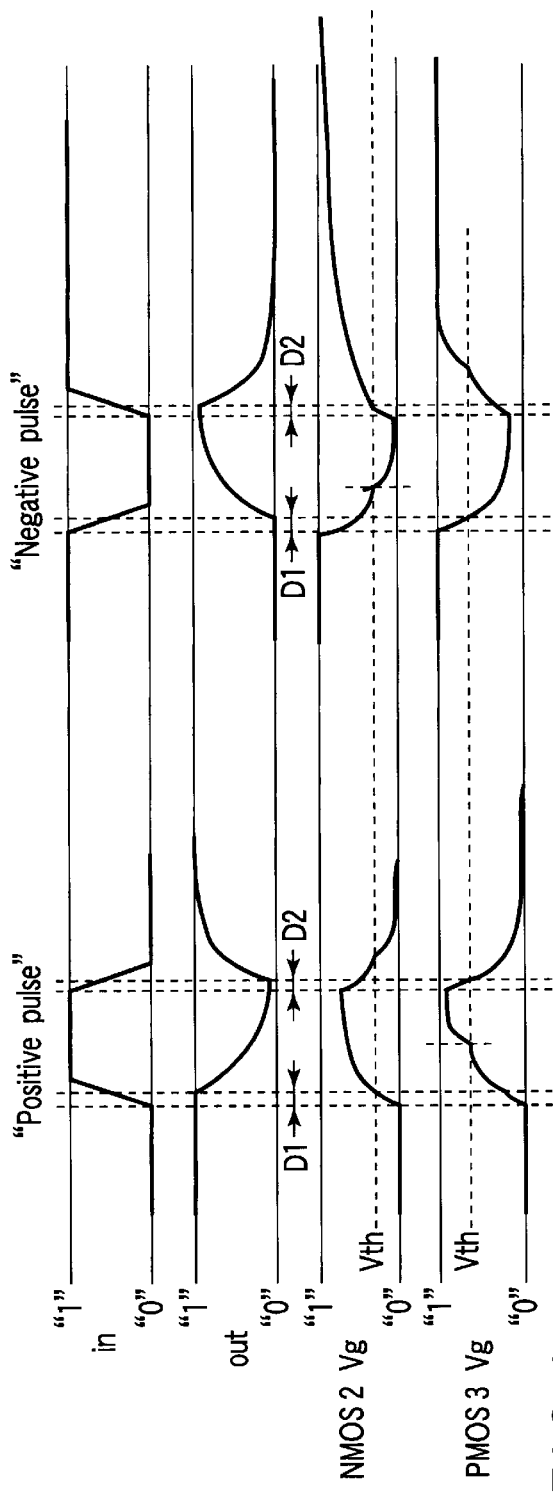
FIG. 4 is a waveform chart showing the operation of the basic unit element.

FIG. 4 shows the state of the output "out" of the basic unit element 1 for a short pulse width at the input "in" on the basis of the operations of the gate potentials Vg in the composite elements of the NMOS 2 and PMOS 3.

Case of Positive Pulse

As represented by "positive pulse" in FIG. 4, coupling by the capacitance C of the circuit element 4 makes the gate potential Vg of the NMOS 2 rise up to the threshold value similarly to the input "in". When the output "out" falls to "0", the same gate delay D1 as that in a conventional inverter circuit exists. After that, the gate potentials Vg of the NMOS 2 and PMOS 3 change to "0" before fully reaching "1" because "1" level is not held for a sufficient time.

When the input "in" reaches "0", coupling by the capacitance C of the circuit element 4 makes the gate potential Vg of the PMOS 3 change similarly to the input "in". Since the change starts before the gate potential Vg satisfactorily reaches "1", the gate potential Vg reaches the threshold value of the PMOS 3 soon. The output "out" starts changing to "1" with a delay D2 smaller than that of the conventional inverter circuit.

In the basic unit element 1, the leading edge of a negative pulse at the output "out" falls with almost the same gate delay D1 as that of the conventional inverter circuit, but the trailing edge rises with the delay D2 smaller than that of the conventional inverter circuit.

Figure 5:
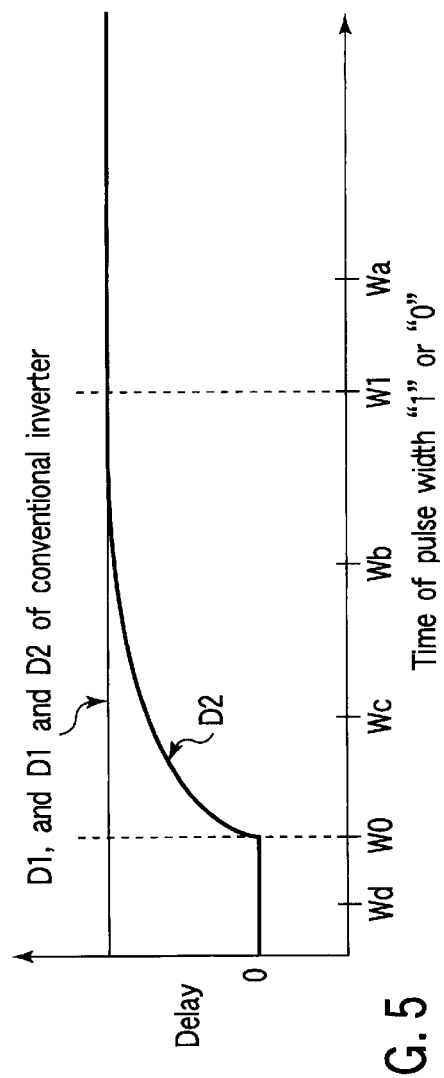
FIG. 5 is a graph showing the relationship between the delay of the basic unit element and the pulse width of an input pulse.

FIG. 5 is a graph showing the relationship between the delays D1 and D2 of the basic unit element 1 and the pulse width of an input pulse.

As shown in FIG. 5, the delay D2 rapidly decreases as the time for a pulse width "1" at the input "in" shortens. The PMOS 3 is not turned off at a given pulse width W0 or less.

For a pulse width W1 or more with which the time for the pulse width "1" at the input "in" is sufficiently long, the gate potential Vg of the PMOS 3 falls after fully reaching "1". Thus, the delay D2 becomes substantially equal to the gate delay D1.

Case of Negative Pulse

As represented by "negative pulse" in FIG. 4, coupling by the capacitance C of the circuit element 4 makes the gate potential Vg of the PMOS 3 falls up to the threshold value similarly to the input "in". When the output "out" rises to "1", the same gate delay D1 as that in the conventional inverter circuit exists. Then, similar to the case of a positive pulse, the input "in" changes to "1" before the gate potentials Vg of the NMOS 2 and PMOS 3 fully reach "0"because "0" level is not held for a sufficient time.

When the input "in" reaches "1", coupling by the capacitance C of the circuit element 4 makes the gate potential Vg of the NMOS 2 change similarly to the input "in". Since the change starts before the gate potential Vg satisfactorily reaches "0", the gate potential Vg reaches the threshold value of the NMOS 2 soon. The output "out" starts changing to "0" with the delay D2 smaller than that of the conventional inverter circuit.

Compared to a negative pulse at the input "in", the leading edge of a positive pulse at the output "out" outputs with almost the same gate delay D1 as that of the conventional inverter circuit, but the trailing edge is output with the delay D2 smaller than that of the conventional inverter circuit.

As shown in the relationship of FIG. 5, this delay D2 also rapidly decreases as the portion "0" of an input pulse decreases. The NMOS 2 is not turned off at a given pulse width W0 or less.

As described above, the delay becomes smaller at the trailing edges of both positive and negative pulses than that of the conventional inverter circuit. The pulse width reduction amount can be designed smaller than the gate delay D1.

As the pulse width of an input pulse becomes shorter, the delay difference between the leading and trailing edges of the pulse becomes larger and the pulse width reduction ratio becomes higher. The pulse width reduction ratio can be adjusted by the number of basic unit elements 1 to be connected.

Further, the pulse can be eliminated if the input pulse has a given pulse width or less.

Cascade-connecting several basic unit elements 1 with these characteristics can implement a pulse width changing circuit capable of reducing the pulse width with a delay smaller than the gate delay of an inverter circuit (logic gate circuit), which is conventionally impossible in principle. Examples of this pulse width changing circuit is shown in FIGS. 6A to 6E and 7A to 7E.

FIG. 6A is a circuit diagram showing an example of the pulse width changing circuit according to the first embodiment of the present invention.

As shown in FIG. 6A, a pulse width changing circuit 5 according to the example is made up of cascade-connecting six basic unit elements 1. The input (NODE0) of the first basic unit element 1 receives an input "in", and the outputs (NODE1 to NODE3) of the second, fourth, and sixth basic unit elements 1 output outputs "out1" to "out3".

FIGS. 6B to 6E are charts schematically showing the relationship between the pulse width of the input "in" and the pulse widths of the outputs "out1" to "out3" in the pulse width changing circuit 5.

FIGS. 6B to 6E depict only reduction of the pulse width without any delay by the gate delay of the basic unit element 1.

W1≦Input Pulse Width Wa

In this case, as shown in FIG. 6B, NODE0 receives an input "in" with a pulse width Wa equal to or larger than a pulse width W1 (see FIG. 5) which makes the delays D1 and D2 substantially equal to each other.

In this case, NODE1 to NODE3 output outputs "out1" to "out3" with the same pulse width Wa as the pulse width Wa of the input "in".

By inputting an input "in" with the pulse width Wa equal to or larger than the pulse width W1 to the pulse width changing circuit 5, the circuit 5 can output outputs "out1" to "out3" which maintain the pulse Wa.

W0<Input Pulse Width Wb<W1; Wb<Wa

In this case, as shown in FIG. 6C, NODE0 receives an input "in" with a pulse width Wb smaller than the pulse width W1 and larger than a pulse width W0 which eliminates the delay D2.

In this case, NODE1 to NODE3 output outputs "out1" to "out3" with pulse widths Wb1 to Wb3 smaller than the pulse width Wb of the input "in". The pulse widths Wb1 to Wb3 satisfy "Wb3<Wb2<Wb1".

By inputting an input "in" with the pulse width Wb smaller than the pulse width W1 and larger than the pulse width W0 to the pulse width changing circuit 5, the circuit 5 can output outputs "out1" to "out3" with pulse widths smaller than the pulse width Wb.

Since the pulse widths Wb1 to Wb3 of the outputs "out1" to "out3" satisfy "Wb3<Wb2<Wb1<Wb", the pulse width Wb of the input "in" can also be reduced stepwise.

Since the outputs "out1" to "out3" can be properly extracted, the pulse widths Wb1 to Wb3 reduced stepwise can be arbitrarily extracted. The pulse width changing circuit 5 can arbitrarily select the pulse widths Wb1 to Wb3 and obtain any number of outputs.

W0<Input Pulse Width Wc<W1; Wc<Wb

In this case, as shown in FIG. 6D, similar to the case shown in FIG. 6C, NODE0 receives an input "in" with a pulse width Wc smaller than the pulse width W1 and larger than the pulse width W0. The case shown in FIG. 6D is different from that shown in FIG. 6C in that the pulse width Wc is smaller than the pulse width Wb.

In this case, NODE1 and NODE2 output outputs "out1" and "out2" with pulse widths Wc1 and Wc2 smaller than the pulse width Wc of the input "in". At NODE3, the pulse disappears.

Like this case, the pulse width changing circuit 5 can eliminate a pulse by changing the input pulse width within a range of the pulse width W0 to the pulse width W1 (both exclusive).

In this case, similar to the case shown in FIG. 6C, the pulse widths Wc1 and Wc2 of the outputs "out1" and "out2" satisfy "Wc2<Wc1<Wc". The pulse width Wc of the input "in" can be reduced stepwise.

Since the outputs "out1" and "out2" can be properly extracted, the pulse widths Wc1 and Wc2 reduced stepwise can be arbitrarily extracted, similar to the case shown in FIG. 6C.

Input Pulse Width Wd<W0

In this case, as shown in FIG. 6E, NODE0 receives an input "in" with a pulse width Wd equal to or smaller than the pulse width W0.

In this case, the pulse disappears at any of NODE1 to NODE3.

In the pulse width changing circuit 5, the pulse disappears at any of NODE1 to NODE3 when the input pulse width is the pulse width W0 or less.

From the characteristic shown in FIG. 6E, the pulse width changing circuit 5 has not only a function of reducing the pulse width but also a filtering function.

That is, the circuit configured by cascade-connecting the basic unit elements 1 can be used as a pulse width changing circuit with a filtering function or simply as a filtering circuit.

FIGS. 7A to 7E are views showing comparison between the feature of the pulse width changing circuit according to the first embodiment and a delay circuit configured by cascade-connecting conventional inverter circuits.

FIG. 7A is a circuit diagram showing a conventional delay circuit 101 configured by cascade-connecting inverter circuits. FIG. 7B is a circuit diagram showing the pulse width changing circuit 5 according to the first embodiment.

FIGS. 7C and 7D show comparison between the waveforms of respective stages (NODE0 to NODE3) when an input with a small pulse width is input to NODE0 of the delay circuit 101 shown in FIG. 7A and NODE0 of the pulse width changing circuit 5 shown in FIG. 7B.

As shown in FIG. 7C, the pulse only receives a predetermined delay without any deformation even if NODE0 of the delay circuit 101 receives an input with a small pulse width, e.g., W0<pulse width<W1 (see FIG. 5).

To the contrary, when NODE0 of the pulse width changing circuit 5 similarly receives an input with a small pulse width, the pulse width is quickly reduced with the same pulse delay amount as that of the delay circuit 101, as shown in FIG. 7D.

When the delay circuit 101 and pulse width changing circuit 5 receive an input with a pulse width large to some extent, e.g., W1≦pulse width (see FIG. 5), the pulse is only delayed in both the circuits 101 and 5 without reducing the pulse width, as shown in FIG. 7E.

This feature cannot be realized by a pulse width changing circuit made up of conventional logic gate circuits.

From the characteristic shown in FIG. 7E, the pulse width changing circuit 5 has not only a function of reducing the pulse width and a filtering function but also a delay function.

In other words, the circuit configured by cascade-connecting the basic unit elements 1 can be used as a pulse width changing circuit with a delay function, as a pulse width changing circuit with delay and filtering functions, as a filtering circuit with a delay function, or simply as a delay circuit or delay line.

Second Embodiment

A composite element which constitutes the basic unit element 1 according to the present invention may be assembled as a composite circuit using a capacitor and resistor. However, the feature that a composite element can be formed by simple elements cannot be satisfactorily exhibited. In the second embodiment, the feature of the composite element is realized as an electrical characteristic of the gate of a single transistor.

Figure 8A:
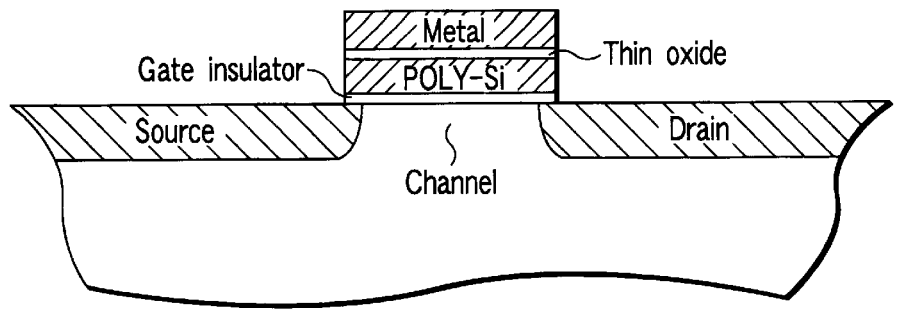
FIG. 8A is a sectional view showing an example of a MOS transistor used in the second embodiment of the present invention.
Figure 8B:
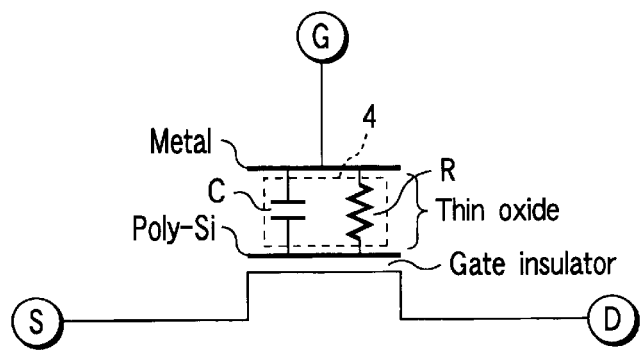
FIG. 8B is an equivalent circuit diagram of the MOS transistor shown in FIG. 8A.

FIG. 8A is a sectional view showing an example of a MOS transistor used in the second embodiment, and FIG. 8B is an equivalent circuit diagram.

As shown in FIG. 8A, the gate structure of the MOS transistor is made of a metal (METAL) such as tungsten stacked on polysilicon (POLY—Si). This gate structure can decrease the gate resistance and implement a high-speed transistor because it can utilize a low metal resistance together with conventional gate characteristics. Further, a thin oxide film (THIN OXIDE) can be formed at the interface between the polysilicon and metal.

The gate of the above structure has a MIS structure when viewed from the metal toward the channel region (CHANNEL) of the MOS transistor. An equivalent circuit exhibiting the electrical characteristic of this structure is made up of a capacitance C and resistance R parallel to each other.

As shown in FIG. 8B, this equivalent circuit is identical to the equivalent circuit of the circuit element 4 of the composite element in the first embodiment. The capacitance C is generated by using the metal and polysilicon as one and the other electrodes, and using the thin oxide film as a dielectric film. The resistance R can be generated by the tunnel effect via the thin oxide film between the metal and polysilicon.

This gate structure is obtained by only forming a thin oxide film at the interface between the polysilicon and metal in the step of forming the gate of a MOS transistor. The formation step is almost the same as that of a general MOS transistor, and the shape is also the same.

Third Embodiment

When the circuit element 4 is built in the gate of a transistor to attain a composite element, like the second embodiment, a monitor must be integrated in an IC chip in some cases in order to check the characteristics. The third embodiment relates to this arrangement.

Figure 9:
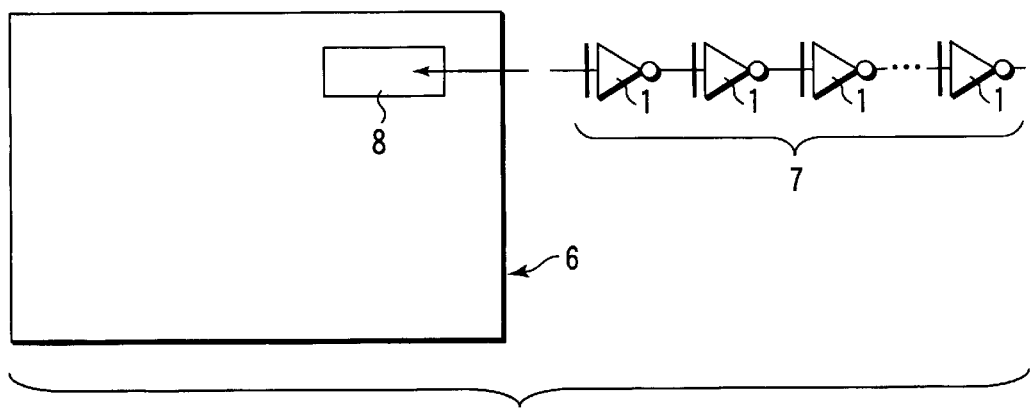
FIG. 9 is a block diagram showing an example of a semiconductor integrated circuit device according to the third embodiment of the present invention.

FIG. 9 is a block diagram showing an example of a semiconductor integrated circuit device according to the third embodiment.

To check the characteristics of an IC transistor using even part of a MOS transistor having the gate structure shown in FIGS. 8A and 8B, a monitoring circuit 8 including a delay line 7 prepared by cascade-connecting basic unit elements 1 is formed in part of an IC chip 6. A pulse with a short pulse width is supplied to the delay line 7 to monitor the pulse reduction ratio.

Information obtained by monitoring whether a desired pulse reduction ratio is obtained can be fed back to the IC manufacturing process or used to adjust the circuit system.

In adjusting the circuit system, an operation suitable for the characteristics of the basic unit element 1, composite element, and the like is selected for the circuit system by switching the circuit using an element such as a fuse or programming the resistor.

Figure 10:
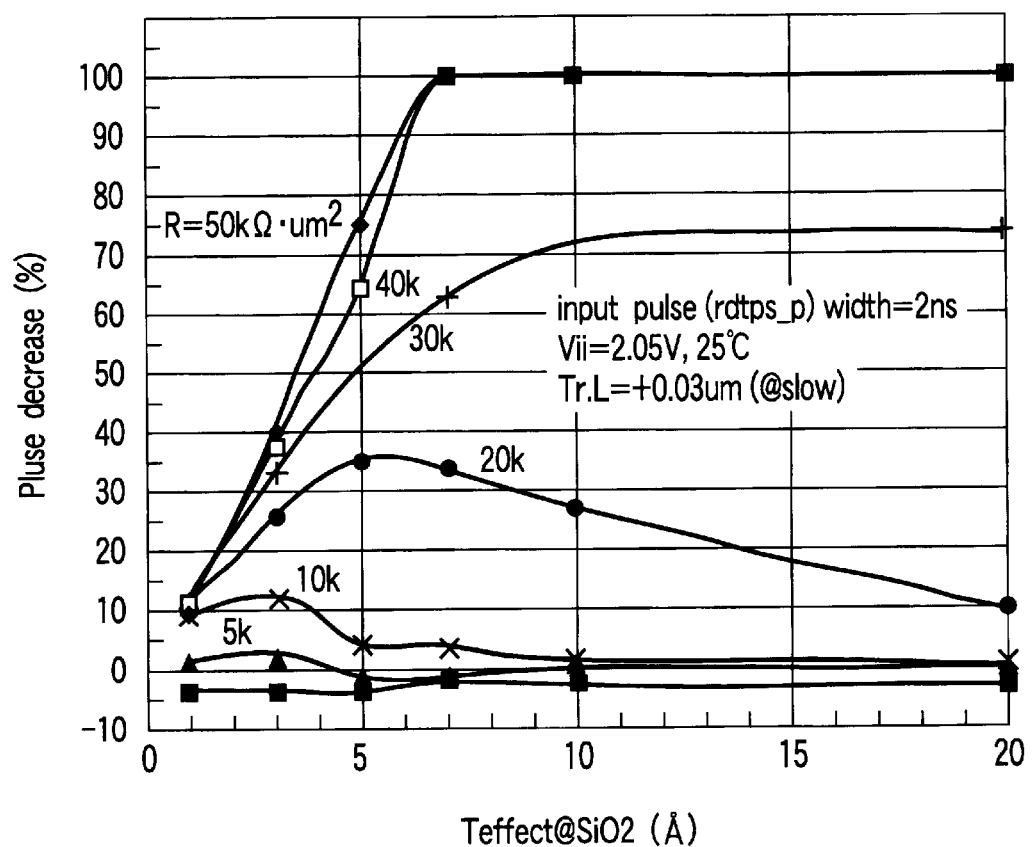
FIG. 10 is a graph showing the relationship between a capacitance C in conversion into an oxide film thickness and the pulse decrease for each resistance R.

FIG. 10 shows the results of the pulse reduction ratio when the capacitances C and resistances R in the circuit elements 4 of all the basic unit elements 1 on a given delay line are changed at once.

The ordinate represents in % the pulse decrease when a 2 ns pulse is input to the delay line, and "100%" means that the pulse disappears. The abscissa represents the capacitance C in conversion into an oxide film thickness (Teffect@SiO$_2$) in Å. Each resistance R is a resistance kΩ per unit area ($\mu m^2$) as a contact resistance. The resistance decreases as the area increases.

From the calculation result, if the resistance R of the delay line is 10 kΩ·$\mu m^2$ or less, the pulse decrease is small regardless of the capacitance C, and the characteristics of the basic unit element 1 are weak. To the contrary, if the resistance R is higher than 10 kΩ·$\mu m^2$, the characteristics of the basic unit element 1 are strong.

Although the values of the capacitance C and resistance R change depending on the arrangement of the delay line, various decreases can be obtained from the calculated value. The characteristics can be effectively grasped by inserting the monitoring circuit 8 including the delay line 7 as shown in FIG. 9.

As for a circuit which does not use the pulse width reduction effect or for an LSI, it is also possible to check the pulse width reduction effect by the monitoring circuit 8, adjust the values of the capacitance C and resistance R by controlling the manufacturing process, and manufacture a system in which reduction of the pulse width can be ignored.

A system in which the pulse width reduction effect changes depending on a portion of the LSI can also be constituted.

The first to third embodiments described above can attain the following effects.

According to the first embodiment, the basic unit element 1 is comprised of the NMOS 2 and PMOS 3 with gates each including the circuit element 4 in which the capacitance C and resistance R are parallel-connected as an equivalent circuit. The basic unit element 1 can decrease the delay D2 at the trailing edge to be smaller than the gate delay D1 at the pulse leading edge in accordance with an input pulse width. The use of this characteristic can implement a pulse width changing circuit 5 for reducing the pulse width with an amount smaller than the gate delay amount of the logic gate circuit, which is conventionally impossible in principle.

This pulse width changing circuit 5 can realize setting of a smaller pulse width and finer tuning of a circuit system, which are conventionally impossible. This is very effective for a circuit system predicted to increase in operation speed. The pulse width changing circuit 5 can also constitute a system for reducing the pulse width by a small analog amount. Furthermore, the pulse width changing circuit 5 can selectively decrease the pulse width or eliminate the pulse itself.

Since a conventional pulse width changing circuit is configured by a combination of an AND or OR gate and a delay circuit 101 including a plurality of logic gate circuits, as shown in FIGS. 13A, 13B, 14A, 14B, 15A, and 15B, it requires a large number of circuit elements and is bulky.

However, the pulse width changing circuit 5 described in the first embodiment can be obtained by cascade-connecting the basic unit elements 1, so that the number of circuit elements can be decreased in comparison with the conventional pulse width changing circuit. The pulse width changing circuit 5 described in the first embodiment is more advantageous for increasing the integration degree of a semiconductor integrated circuit device and reducing the chip area than the conventional pulse width changing circuit.

According to the second embodiment, the gate of a MOS transistor has a multilayered structure of a conductive polysilicon layer and metal layer. In addition, capacitance and resistance components are given to the interface between the conductive polysilicon layer and the metal layer.

In the MOS transistor having this gate structure, the circuit element 4 in which the capacitance C and resistance R are parallel-connected as an equivalent circuit can be obtained only by simply forming a gate. Hence, the pulse width changing circuit 5 described in the first embodiment can be attained without adding any extra circuit.

According to the third embodiment, the monitoring circuit 8 formed from a MIS transistor described in the second embodiment is integrated in a partial region of the IC chip 6, and monitors the capacitance C and resistance R of the MIS transistor which forms the monitoring circuit 8. The pulse width decrease amount of a pulse delay line within the IC chip 6 is controlled based on the monitoring result, i.e., information obtained from the monitoring circuit 8.

The IC chip 6 having the monitoring circuit 8 enables ignoring or controlling the pulse width decrease on the basis of information obtained from the monitoring circuit 8.

The present invention has been described by the first to third embodiments, but is not limited to these embodiments. The present invention can be variously modified without departing from the spirit and scope of the invention.

Figure 11:
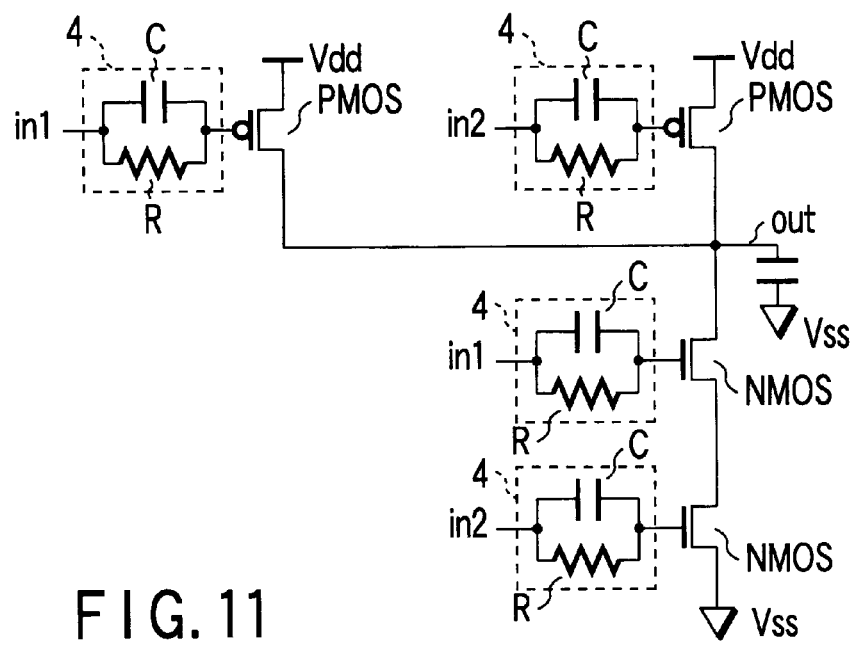
FIG. 11 is an equivalent circuit diagram showing another example of the basic unit element.
Figure 12:
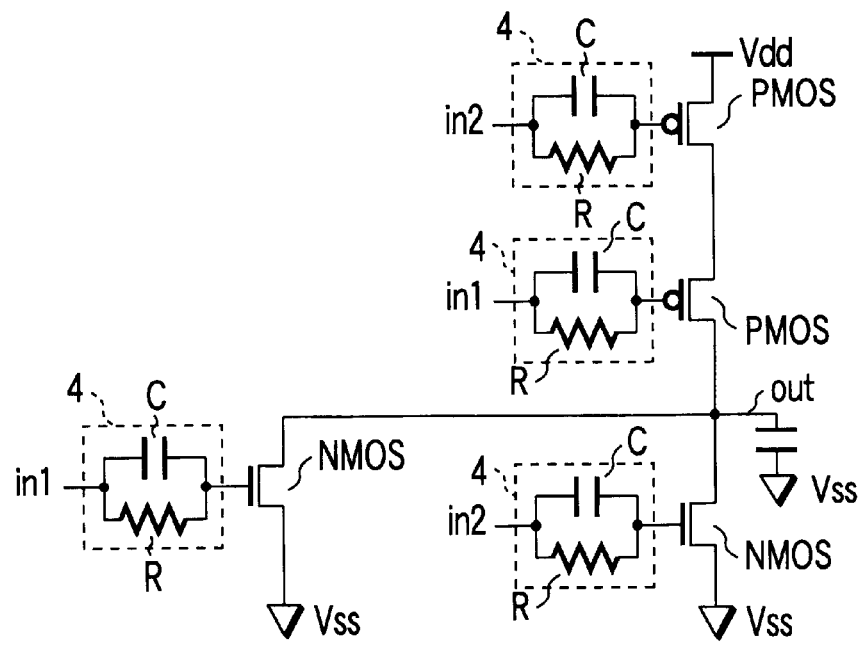
FIG. 12 is an equivalent circuit diagram showing still another example of the basic unit element.
Figure 13A:
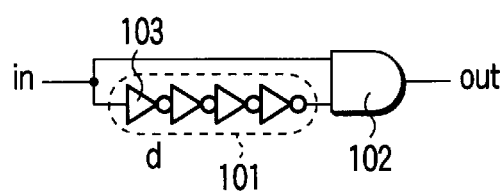
FIG. 13A is a circuit diagram showing a conventional circuit for reducing the pulse width.
Figure 13B:
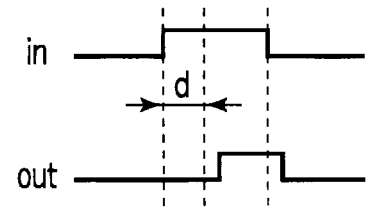
FIG. 13B is a waveform chart showing the operation of the pulse width reduction circuit shown in FIG. 13A.
Figure 14A:
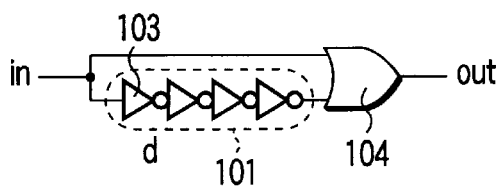
FIG. 14A is a circuit diagram showing a conventional circuit for widening the pulse width.
Figure 14B:
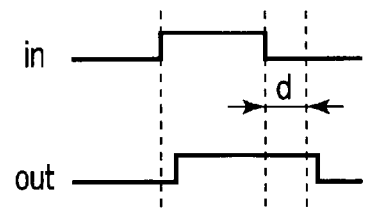
FIG. 14B is a waveform chart showing the operation of the circuit for widening the pulse width shown in FIG. 14A.
Figure 15A:
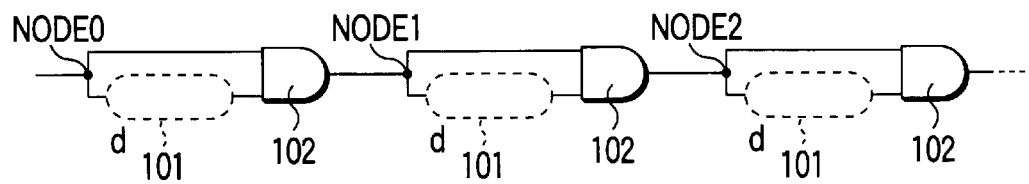
FIG. 15A is a circuit diagram showing a conventional circuit for reducing a long input pulse.
Figure 15B:
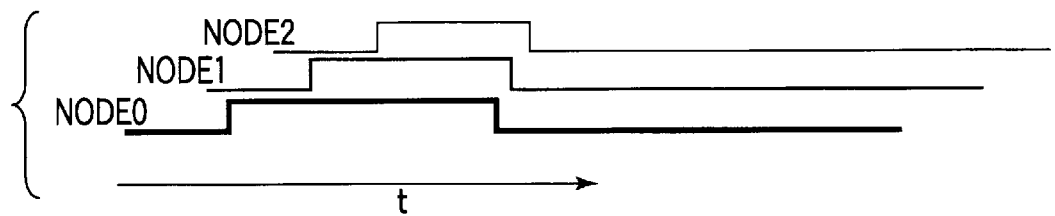
FIG. 15B is a waveform chart showing an output waveform example of the circuit shown in FIG. 15A.

For example, in the above embodiments, the basic unit element 1 is constituted similarly to a conventional inverter circuit, as shown in FIGS. 1A and 1B. Alternatively, the basic unit element 1 may be constituted similarly to a NAND gate, as shown in FIG. 11, or to a NOR gate, as shown in FIG. 12.

In the above embodiments, the transistor is a MOS (Metal-Oxide-Semiconductor) transistor. However, the gate insulating film is not limited to an oxide film and can take any film as far as it can insulate the gate from the channel. In other words, the transistor may be of any type as far as it is a MIS (Metal-Insulator-Semiconductor) transistor.

The above embodiments can be appropriately combined.

The above embodiments include various stages of the invention, and various stages of the invention can also be extracted by properly combining a plurality of composing elements disclosed in the above embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a plurality of MIS transistors, each of said MIS transistors having a gate including a circuit element represented by an equivalent circuit in which a capacitance and a resistance are parallel-connected; and
   an integrated circuit unit including logic gate circuits configured by a combination of said plurality of MIS transistors
   wherein a gate of said MIS transistor includes a conductive polysilicon layer and a metal layer, and
   an interface between the conducive polysilicon layer and the metal layer has capacitance and resistance components.

2. The device according to claim 1, wherein said plurality of MIS transistors include both P- and N-channel MIS transistors, and
   said logic gate circuits include inverter circuits configured by a combination of said P- and N-channel MIS transistors.

3. The device according to claim 1, wherein said plurality of MIS transistors include both P- and N-channel MIS transistors, and
   said logic gate circuits include NAND gate circuits configured by a combination of said P- and N-channel MIS transistors.

4. The device according to claim 1, wherein said plurality of MIS transistors include both P- and N-channel MIS transistors, and
   said logic gate circuits include NOR gate circuits configured by a combination of said P- and N-channel MIS transistors.

5. The device according to claim 1, wherein said integrated circuit unit has a pulse width changing function in which a pulse width of an input pulse changes in accordance with said pulse width of said input pulse.

6. The device according to claim 5, wherein said pulse width changing function reduces a pulse width of an input pulse by an amount smaller than a gate delay amount of said logic gate circuit.

7. The device according to claim 6, wherein said pulse width changing function reduces said pulse width of the input pulse stepwise.

8. The device according to claim 7, wherein said pulse width reduced stepwise can be arbitrarily extracted.

9. The device according to claim 1, wherein said integrated circuit unit has a pulse width changing function capable of selecting in accordance with a pulse width of an input pulse whether to reduce said pulse width of said input pulse or to eliminate said input pulse.

10. The device according to claim 1, wherein said integrated circuit unit has a pulse width changing function capable of selecting in accordance with a pulse width of an input pulse whether to maintain or reduce said pulse width of said input pulse.

11. The device according to claim 1, wherein said integrated circuit unit has a pulse width changing function capable of selecting in accordance with a pulse width of an input pulse whether to maintain said pulse width of said input pulse, reduce said pulse width of said input pulse, or eliminate said input pulse.

12. The device according to claim 1, wherein said integrated circuit unit has a filtering function capable of selecting in accordance with a pulse width of an input pulse whether to pass or not to pass said input pulse.

13. The device according to claim 1, wherein said integrated circuit unit has a pulse width changing function and a filtering function capable of selecting in accordance with a pulse width of an input pulse whether to reduce said pulse width and pass said input pulse or not to pass said input pulse.

14. The device according to claim 1, wherein said integrated circuit unit has a pulse width changing function and a filtering function capable of selecting in accordance with a pulse width of an input pulse whether to maintain said pulse width and pass said input pulse, to reduce said pulse width and pass said input pulse, or not to pass said input pulse.

15. The device according to claim 1, whether said integrated circuit unit has a delay function and a filtering function capable of selecting in accordance with a pulse width of an input pulse whether to delay said input pulse in accordance with a gate delay amount of said logic gate circuit while maintaining said pulse width, or not to pass said input pulse.

16. The device according to claim 1, wherein said integrated circuit unit has a delay function and a pulse width changing function capable of selecting in accordance with a pulse width of an input pulse whether to delay said input pulse in accordance with a gate delay amount of said logic gate circuit while maintaining said pulse width, or to reduce said pulse width of said input pulse and pass said input pulse.

17. The device according to claim 1, wherein said integrated circuit unit has a delay function, a pulse width changing function, and a filtering function capable of selecting in accordance with a pulse width of an input pulse whether to delay said input pulse in accordance with a gate delay amount of said logic gate circuit while maintaining said pulse width, to reduce said pulse width of said input pulse and pass said input pulse, or not to pass said input pulse.

18. The device according to claim 1, wherein said logic gate circuits are cascade-connected.

19. The device according to claim 1, wherein said capacitance and resistance components are obtained by an insulating layer present at said interface between said conductive polysilicon layer and said metal layer.

20. The device according to claim 1, further comprising:
a monitoring circuit which includes said plurality of MIS transistors and can monitor said capacitance and resistance components of said MIS transistors.

21. The device according to claim 20, further comprising:
a pulse delay line configured by a combination of said logic gate circuits, a pulse decrease of said pulse delay line being controlled based on a result of monitoring said capacitance and resistance components of said MIS transistors.

22. The device according to claim 20, wherein said monitoring circuit includes a pulse delay line configured by cascade-connecting said logic gate circuits.

23. The device according to claim 1, wherein said resistance component has a resistance higher than $10 \text{ k}\Omega \cdot \mu m^2$.

24. The device according to claim 1, wherein said resistance component has a resistance not more than $10 \text{ k}\Omega \cdot \mu m^2$.

* * * * *